US006735234B1

(12) United States Patent
Paschotta et al.

(10) Patent No.: US 6,735,234 B1
(45) Date of Patent: May 11, 2004

(54) PASSIVELY MODE-LOCKED OPTICALLY PUMPED SEMICONDUCTOR EXTERNAL-CAVITY SURFACE-EMITTING LASER

(75) Inventors: Ruediger Paschotta, Zurich (CH); Reto Haering, Zurich (CH); Ursula Keller, Zurich (CH)

(73) Assignee: Giga Tera AG, Dietikon (CH)

( * ) Notice: Subject to any disclaimer, the term of this patent is extended or adjusted under 35 U.S.C. 154(b) by 0 days.

(21) Appl. No.: 09/502,959

(22) Filed: Feb. 11, 2000

(51) Int. Cl.[7] .............................................. H01S 3/091
(52) U.S. Cl. .......................... 372/75; 372/99; 372/18; 372/50; 372/47; 372/10; 372/13; 372/36; 372/74
(58) Field of Search ............................ 372/75, 99, 18, 372/50, 47, 10, 13, 36, 74

(56) References Cited

U.S. PATENT DOCUMENTS

| 5,461,637 | A | * | 10/1995 | Mooradian et al. ........... 372/11 |
| 5,469,454 | A | * | 11/1995 | Delfyett, Jr. ................... 372/11 |
| 5,548,433 | A | * | 8/1996 | Smith .......................... 359/158 |
| 5,652,763 | A | * | 7/1997 | Delfyett, Jr. ................. 372/107 |
| 5,987,049 | A | * | 11/1999 | Weingarten et al. .......... 372/11 |
| 6,243,407 | B1 | * | 6/2001 | Mooradian .................... 372/82 |
| 6,252,892 | B1 | * | 6/2001 | Jiang et al. .................... 372/10 |
| 6,327,293 | B1 | * | 12/2001 | Salokatve et al. ............. 372/96 |
| 6,393,035 | B1 | * | 5/2002 | Weingarten et al. .......... 372/18 |

FOREIGN PATENT DOCUMENTS

| JP | 04056293 A | | 2/1992 |
| WO | WO 01/43242 | * | 6/2001 |

OTHER PUBLICATIONS

R. Haring, R. Paschotta, E. Gini, Morier–Genound, D. Martin, H. Melchoir and U. Keller, "Picosecond surface-emitting semiconductor laser with . 200mW average power" Electronics Letters, Jun. 7, 2001, vol. 37 No. 12.*

W.B. Jiang, R. Mirin and J.E. Bowers; mODE–Locked gAas Vertical Cavity Surface Emitting Lasers; Mode–locked GaAs vertical cavity surface emitting lasers; Appl. Phys. Lett. 60 (6), Feb. 10, 1992.

M. A. Holm, P. Cusumano, D. Burns, A.I. Ferguson, M.D. Dawson; Mode–locked operation of a diode–pumped, external–cavity GaAs/AlGaAs surface emitting laser; CLEO '99 Technical Digest, Baltimore 1999, paper CTuK63).

(List continued on next page.)

*Primary Examiner*—Paul Ip
*Assistant Examiner*—Delma R Flores Ruiz
(74) *Attorney, Agent, or Firm*—Oppedahl & Larson LLP

(57) ABSTRACT

A passively mode-locked optically pumped semiconductor vertical-external-cavity surface-emitting laser (OPS-EXSEL) is disclosed. The laser is mode locked by a semiconductor saturable absorber mirror (SESAM) which forms part of an external cavity. Both the beam-quality limitations of edge-emitting lasers, and the power restrictions of electrically pumped surface-emitting lasers are overcome. The laser uses a semiconductor wafer in which a stack of quantum wells is grown adjacent to a single Bragg-mirror structure. Light from one or more multi-mode high-power diode lasers is focused onto the face of the wafer and pumps the wells by absorption in the barrier regions. The area of the laser mode on the active mirror can be about $10^4$ times larger than the mode area on the facet of an edge-emitting laser, offering scope for the generation of high average power and large pulse energy. At the same time the external cavity enforces fundamental mode operation in a circular, near-diffraction-limited beam. With the laser, sub-picosecond pulse durations are achievable by eliminating coupled cavity effects and by external pulse compression. Band-gap engineering can be used to shape the pulses, or even integrate gain and saturable absorption within the same wafer. Thus, rugged, efficient pulsed laser sources with high average power in a nearly diffraction-limited beam, sub-picosecond pulse durations and multi-GHz repetition rates, which operate in a broad range of wavelengths accessible by bandgap engineering are made possible.

36 Claims, 6 Drawing Sheets

OTHER PUBLICATIONS

Mark Kuznetsov, Farhad Hakimi, Robert Sprague, A. Mooradian; Design and Characteristics of High–Power (>0.5–WCW) Diode–Pumped Vertical–External–Cavity Surface–Emitting Semiconductor Lasers with Circular TEM00 Beams; IEEE Journal of Selected Topics in Quantum Electronics, vol. 5, No. 3, May/Jun. 1999.

M. Kuznetsov, F. Hakimi, R. Sp5rague and A. Morradian; High–Power (>0.5W CW) Diode–Pumped Vertical–External–Cavity Surface–Emitting Semiconductor Lasers with Circular TEM00 Beams; IEE Photonics Technology Letters, vol. 9, No. 8, Aug. 1997.

Patent Abstracts of Japan, vol. 016, No. 225 (E–1214), Jun. 10, 1992, & JP 04 056293 A (Matsushita Electron Corp), Feb. 24, 1992 abstract.

Keller U et al: "Semiconductor Saturable absorber Mirrors (Sesam's) for Femtosecond to Nanosecond Pulse Generation in Solid–State Lasers"; IEEE Journal of Selected Topics in Quantum Electronics, US, IEEE Service Center, vol. 2, No. 3, Sep. 1, 1996, pp. 435–451, XP000689812; ISSN: 1077–260X.

Shin Arahira et al: "Mode–Locking at Very High Repetition Rates More Than Terahertz in Passively Mode–Locked Distributed –Bragg–Reflector Laser Diodes"; IEEE Journal of Quantum Electronics, IEEE Inc. New York, US, vol. 32, No. 7, Jul. 1, 1996, pp. 1211–1244, XP000598847, ISSN: 0018–9197.

Dowd P et al: "Mode–locking of an InGaAs VCSEL in an external cavity"; LEOS '95, IEEE Lasers and Electro–Optics Society 1995 Annual Meeting. 8th Annual Meeting. Conference Proceedings (Cat. No. 95Ch35739), LEOS '95, IEEE Lasers and Electro–Optics Society 1995 Annual Meeting. 8th Annual Meeting. Conference Proceedings, SA, pp. 139–140, vol. 2, XP000996192, 1995, New York, NY, USA, IEEE, USA, ISBN: 0–7803–2450–1.

Haring R et al: "Passively mode–locked diode–pumped surface–emitting semiconductor laser"; OSA Trends in Optics and Photonics. Advanced Solid State Lasers. vol. 34, Proceedings, Proceedings of Topical Meeting on Advanced Solid–State Laser (ASSL 2000), Davos, Switzerland, Feb. 13–16, 2000, pp. 599–602, XP00095922 2000, Washington, DC, USA, Opt. Soc. America, USA; ISBN: 1–55752–628–1.

* cited by examiner

PASSIVELY MODE-LOCKED OPTICALLY PUMPED SEMICONDUCTOR EXTERNAL-CAVITY SURFACE-EMITTING LASER

FIELD OF THE INVENTION

This invention relates to pulsed lasers and to methods for generating pulsed laser radiation and, more particularly, to passively. mode-locked optically pumped semiconductor external-cavity surface-emitting lasers (OPS-EXSELs).

BACKGROUND OF THE INVENTION

Semiconductor lasers are known in the art. Their laser gain medium consists of a semiconductor material such as InGaAs. In most cases, they do not require any external resonator because the end faces of the semiconductor material can be designed as the resonator mirrors. They can be pumped electrically by applying an appropriate voltage to the semiconductor material. The so-called bandgap engineering, a technique making use of the large number of known semiconductor materials and laser designs, offers a great variety of emittable wavelengths in the infrared and visible range. Semiconductor lasers are small and compact, and can be manufactured in great masses at low costs.

Semiconductor lasers can be designed either as edge-emitting lasers or as surface-emitting lasers. Edge-emitting lasers are the most common form of semiconductor lasers, but this concept very much limits the mode area in the device. For ultrashort pulse generation, a consequence of this is that the pulse energy is also limited to values far below what is achievable, e.g., with lasers based on ion-doped crystals. Also a high average output power (a few watts or more) cannot be generated with good transverse beam quality. These problems can be solved with surface-emitting semiconductor lasers, where the mode areas can be greatly increased, particularly if the device is optically pumped.

Electrically pumped vertical-cavity surface-emitting lasers (VCSELs) known to date are limited in their output power or in terms of beam quality. That is because in a small-area VCSEL the heat dissipation limits the driving current, while in a large-area VCSEL the pump distribution is not uniform enough to support fundamental-transversal-mode operation. With optical pumping the problem of the pump uniformity can be overcome and an external cavity ensures stable fundamental mode operation even with a large mode size. (M. Kuznetsov et al., "High-power (>0.5-W CW) diode-pumped vertical-external-cavity surface-emitting semiconductor lasers with circular $TEM_{00}$ beams", IEEE Phot. Tech. Lett.,Vol. 9, No. 8, p. 1063, 1997) The extensive gain bandwidth of semiconductor quantum well lasers is attractive for ultrashort pulse generation. Lasers emitting short (in the nanosecond and sub-nanosecond range) or ultrashort (in the sub-picosecond range) pulses are known in the art. A well-known technique for short or ultrashort pulse generation is mode locking. Mode locking is a coherent superposition of longitudinal laser-cavity modes. It is forced by a temporal loss modulation which reduces the intracavity losses for a pulse within each cavity-roundtrip time. This results in an open net gain window, in which pulses only experience gain if they pass the modulator at a given time. The loss modulation can be formed either actively or passively. Active mode locking is achieved, for instance, using an acousto-optic modulator as an intracavity element, which is synchronized to the cavity-roundtrip time. Active mode locking of a diode-pumped quantum well laser has, e.g., been achieved with an intra-cavity acousto-optic prism, giving pulse lengths of 100–120 ps (M. A. Holm, P: Cusumano, D. Burns, A. I. Ferguson and M. D. Dawson, CLEO '99 Technical Digest, Baltimore 1999, paper CTuK63).

However, ultra-short-pulse generation relies on passive mode-locking techniques, because only a passive shutter is fast enough to shape and stabilize ultrashort pulses. Passive mode locking relies on a saturable absorber mechanism, which. produces decreasing loss with increasing optical intensity. When the saturable-absorber parameters are correctly adjusted for the laser system, stable and self-starting mode locking is obtained. Saturable-absorber mode locking of diode lasers has been widely investigated, originally using a semiconductor saturable absorber mirror (SESAM) in an external cavity (Y. Silberberg, P. W. Smith, D. J. Eilenberger, D. A. B. Miller, A. C. Gossard and W. Woiegan, Opt. Lett. 9, 507, 1984), and more recently in monolithic devices, which use sections of reverse-biased junction to provide saturable absorption (for a review, see "Ultrafast Diode Lasers: Fundamentals and Applications", edited by P. Vasilev, Artech House, Boston, 1995). A harmonically mode-locked monolithic laser was shown to generate picosecond pulses at a repetition rate variable up to 1.54 THz (S. Arahira, Y. Matsui and. Y. Ogawa, IEEE J. Quantum Electron. 32, 1211, 1996); however such devices are limited to a few tens of milliwatts of output power.

Another approach for short-pulse generation was to use a mode-locked dye or solid-state laser as a synchronous optical pump for a vertical-external-cavity surface-emitting laser (VECSEL) (W. B. Jiang, R. Mirin and J. E. Bowers, Appl. Phys. Lett. 60, 677, 1992). These lasers typically produced chirped pulses with a length of about 20 ps, which were externally compressed to sub-picosecond, and even sub-100-femtosecond duration (W. H. Xiang, S. R. Friberg, K. Watanabe, S. Machida, Y. Sakai, H. Iwamura and Y. Yamamoto, Appl. Phys. Lett. 59, 2076, 1991). The general drawback of this approach, which prevents widespread applications, is that the pumping laser itself has to deliver ultrashort pulses. This severely limits the attractiveness of the overall system in terms of complexity, size, cost, and achievable pulse repetition rate.

In U.S. Pat. No. 5,461,637 (Mooradian et al.), a vertical-cavity surface-emitting laser (VCSEL) is disclosed with a quantum-well region formed over a semiconductor substrate. A first reflective surface is formed over the quantum-well region, and a second reflective surface is formed over the substrate, opposite the first reflective surface, forming a laser cavity. However, there is no teaching about measures to be taken for mode locking such a VCSEL.

SUMMARY OF THE INVENTION

It is an object of this invention to provide a simple, robust laser emitting short (in the picosecond range) or ultrashort (in the sub-picosecond range) pulses, with a high repetition rate (in the range of a few GHz or higher), with a high optical average output power (of at least hundreds of milliwatts) and a good beam quality (coefficient of beam quality $M^2 \leq 5$; cf. T. F. Johnston, Jr., "$M^2$ concept characterizes beam quality", Laser Focus World, May 1990).

It has been found that the combination of an optically pumped external-cavity surface-emitting laser (EXSEL) with a semiconductor saturable absorber structure solves the above problem. Thus the laser according to the invention comprises a surface-emitting semiconductor laser with an external cavity. The laser is pumped optically, preferably with a high-power diode laser bar. Finally, it is passively mode-locked with a SESAM in the external cavity, or alternatively with a saturable absorber which is incorporated into the semiconductor laser structure. SESAM stands here for any semiconductor saturable absorber structures, which have sometimes been termed A-FPSA (Opt. Lett. 17, 505, 1992), SBR (Opt. Lett. 20, 1406, 1995), D-SAM (Opt. Lett. 21, 486, 1996), semiconductor doped dielectric layers (Opt. Lett. 23, 1766, 1998), or colored glass filters (Appl. Phys. Lett. 57, 229, (1990), for example. Any other saturable absorbers could be used which allow to adjust the operation parameters for stable mode locking (cf. C. Hönninger et al., "Q-switching stability limits of cw passive mode locking", J. Opt. Soc. Am. B 16, 46, 1999).

More particularly, the laser according to the invention comprises:
- a first reflective element and a second reflective element being separated therefrom, said first and second reflective elements defining an optical resonator for laser radiation;
- an essentially plane semiconductor gain structure having a surface extending essentially in a surface plane, for emitting said laser radiation;
- means for exciting said semiconductor gain structure to emit said laser radiation from said surface plane, said exciting means comprising a pumping source for emitting pumping radiation which impinges on said semiconductor gain structure; and
- a semiconductor saturable absorber structure for mode locking said laser radiation.

The method for generating pulsed electromagnetic laser radiation according to the invention comprises the steps of:
- generating pumping radiation;
- exciting an essentially plane semiconductor gain structure, which has a surface extending essentially in a surface plane, to emit laser radiation from said surface, by impinging said pumping radiation on said semiconductor gain structure;
- recirculating said laser radiation in an optical resonator; and
- mode locking said laser radiation by means of a semiconductor saturable absorber structure.

In the following we explain how this invention solves a number of problems which are related to previously used approaches. By using a semiconductor gain material, a broad amplification bandwidth is obtained as required for the generation of ultrashort pulses. The relatively small saturation energy of the semiconductor gain medium is beneficial for pulse generation at high repetition rates, as explained below. The surface-emitting geometry allows for a relatively large laser-mode area which reduces the optical peak intensities on the semiconductor and thus allows for large pulse energies. For operation with multi-watt output powers, electrical pumping of the gain medium is not a good option because in this way it is difficult to obtain a sufficiently uniform pumping density over a large mode area. Optical pumping eliminates this problem and at the same time gives more design freedom for the optimization of the gain structure. A high-power diode bar is most suitable as a pumping source, being compact and delivering tens of watts of pumping light with good efficiency, while the poor beam quality is not important due to the very small absorption length of the gain structure. Furthermore, the external laser cavity determines the laser repetition rate (via the cavity length) and also allows to incorporate a SESAM. The latter (or alternatively, a saturable absorber incorporated into the gain structure) leads to mode locking, i.e., the formation of short or ultrashort pulses with a spacing according to the laser cavity length.

The relatively small saturation energy of the semiconductor gain medium is very important for pulse generation at high repetition rates. Other passively mode-locked lasers, based on ion-doped crystals, have a much larger gain saturation energy. (This is particularly the case for most ion-doped gain materials with broad amplification bandwidth, as required for sub-picosecond pulse generation.) For this reason, such lasers have a tendency for Q-switching instabilities (or Q-switched mode locking, QML, see C. Hönninger et al, J. Opt. Soc. Am. B 16, 46, 1999). This tendency is very difficult to suppress if a high pulse repetition rate is required, and particularly if a high output power is required at the same time. Because of their much smaller gain saturation energy, semiconductor lasers substantially do not exhibit these problems and therefore are suitable for the generation of pulse trains with high repetition rates and high average powers.

An important design criterion is that the saturation energy of the laser gain structure must be larger than the saturation energy of the saturable absorber. For stable mode locking, the ratio of these two quantities preferably should be 2 or even larger. If a SESAM is used for passive mode locking, its saturation energy can be adjusted both by the SESAM design and by the mode area on the SESAM, the latter being controlled by the laser cavity design. Typically, the mode area on the SESAM would be significantly smaller (e.g., more than five times smaller and preferably more than ten times smaller) than the mode size on the gain structure. For a saturable absorber which is incorporated in the gain structure, a suitable ratio of saturation energy can be obtained through a proper design. In particular, the device can be designed so that the optical intensities in the absorber structure are larger than the intensities in the gain structure, e.g., by exploiting the spatially varying intensities due to a standing-wave field in the structure or by coupled cavities, where in one cavity is the gain and in the other the absorber. For broad-band operation, the coupled cavity should be at antiresonance. Alternatively, the intrinsic saturation energies of absorber and gain structure can be controlled by band gap engineering.

For ultrashort pulse generation, the design of the laser gain structure must avoid bandwidth-limiting coupled-cavity effects which can arise from internal reflections, e.g., from the surface of the laser gain structure. Such reflections effectively modulate the gain spectrum of the device, which limits the usable gain bandwidth. One possibility is to suppress such reflections by arranging semiconductor layers (or possibly layers made from other materials such as dielectrics) so that the reflections from the single interfaces effectively cancel out. (This is basically the principle of anti-reflection coatings.) Another possibility is to allow for some reflection from the surface of the gain structure, but design the thickness of the whole structure so that it is anti-resonant over the whole wavelength range where there is gain. This somewhat increases the pump threshold of the device, but it also increases the effective gain saturation energy which can be beneficial as explained above.

Reflections from the back side of the semiconductor substrate (on which the gain structure is grown) can also significantly affect the device performance, even if the residual transmission of the Bragg-mirror structure is quite small. The reason for this is that Fabry-Perot effects can arise from the reflections of Bragg mirror and the back side of the substrate. Increasing the reflectivity of the Bragg mirror reduces such effects, but roughening or angle polishing of the substrate is a simple and effective alternative.

The device is preferably operated with a single pulse circulating in the cavity. However, harmonic mode locking may be used to achieve a higher repetition rate.

This means that several pulses are circulating in the laser cavity with a fixed spacing. This regime of operation can be realized, e.g., by addition of a suitable-spectral filter in the laser cavity, or by placing the saturable absorber at a place in the cavity where counterpropagating pulses meet.

It should be noted that the laser concept according to the invention is power scalable. For example, doubling of the output power is possible by using twice the pumping power, while the mode areas on the gain structure and the saturable absorber structure are doubled at the same time. Gain and absorber structure are then operated with the same intensities as in the original device. The temperature rise on both structures is also not significantly increased because the mode diameter can be made larger than the thickness of the gain structure and the absorber structure; for this case, simulations have shown that the heat flows essentially in one dimension, i.e., in the direction in which the thicknesses of the structures are measured. Also the mode-locking performance is not affected due to the unchanged intensities. This scalability is not given for edge-emitting lasers, nor for electrically pumped surface-emitting lasers.

EXSELs (and also VECSELs) use a semiconductor wafer in which one quantum well or a stack of quantum wells is grown adjacent to a single Bragg-mirror structure or a metallic mirror. It is also possible to consider a thicker bulk layer for the gain medium. However, it is expected that quantum-well gain layers are better for the laser threshold, but for mode locking it could be useful that the saturation energy for bulk is higher than in a quantum well. Light from one or more multi-mode high-power diode lasers is focused onto the face of the wafer and pumps the wells by absorption in the barrier regions. The area of the laser mode on the active mirror can be about $10^4$ times larger than the modearea on the facet of an edge-emitting laser, offering scope for the generation of high average power and large pulse energy. At the same time the external cavity enforces fundamental mode operation in a circular, near-diffraction-limited beam.

With the laser according to the invention, sub-picosecond pulse durations are achievable by eliminating coupled cavity effects and by external pulse compression. Such devices are substantially free of the Q-switching tendency that is inherent in passively mode-locked dielectric laser systems with high repetition rates (cf. C. Hönninger, R. Paschotta, F. Morier-Genoud, M. Moser and U. Keller, J. Opt. Soc. Am. B, 16, 46, 1999). Band-gap and device-structure engineering allows to cover a large wavelength region with the same laser technique, and it even allows to shape the pulses or to integrate gain and saturable absorber within the same wafer. Thus the invention makes possible rugged, efficient pulsed laser sources with high average power in a diffraction-limited beam, sub-picosecond pulse durations, and multi-GHz repetition rates.

DESCRIPTION OF THE PREFERRED EMBODIMENTS

Figure 1:
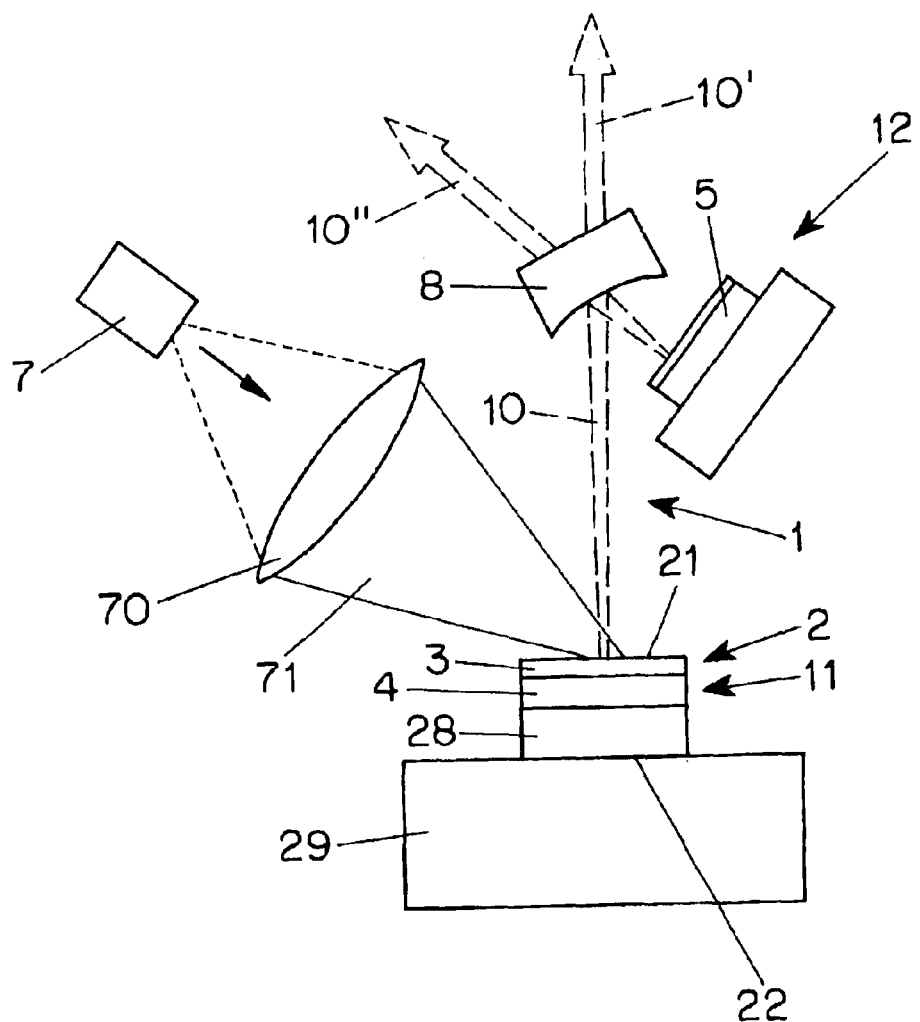
FIG. 1 is a schematic illustration of a preferred embodiment of an EXSEL according to the invention.

FIG. 1 shows a schematic, simplified illustration of a laser according to the invention. The laser comprises an optical resonator 1 delimited by a first reflective element 11 and a second reflective element 12 for reflecting laser radiation 10. In the preferred embodiment of FIG. 1, the first reflective element 11 is a Bragg reflector 4; alternatively, the first reflective element 11 could be a metallic reflective layer. The second reflective element 12 is a semiconductor saturable absorber mirror (SESAM) 5 for passively mode locking the laser; a preferred embodiment of the SESAM 5 is described below with reference to FIG. 3. The laser further comprises a multiple-quantum-well (MQW) gain structure 3. The quantum-well gain structure 3 and the Bragg reflector 4 are realized as adjacent stacks of semiconductor layers grown on a semiconductor substrate 28; this multiple-function element will be referred to as an "active-mirror element" 2 and is described in detail with reference to FIG. 2. The active-mirror element 2 is mounted on a heat sink 29, preferably by a back surface 22. Alternatively, the device could be cooled by contact with a transparent heat sink on a front surface 21, e.g., a piece of sapphire bonded to the semiconductor.

The gain structure 3 is optically pumped by pumping light 70 which pumps the quantum wells in the multiple-quantum-well gain structure 3 by absorption in the barrier regions. The pumping light 70 is preferably generated by one or more multi-mode high-power diode pumping lasers 7 and focused onto a front surface of the active-mirror element 2 by pump optics 71. Alternatively, the pumping light 70 may also be delivered through an optical fiber. For example, a 2-W broad stripe diode laser 7 emitting at 810 nm can be used to pump the gain structure 3 continuously with up to 1.6 W focused onto a region with an area of about 90×90 $\mu$m$^2$ on the front surface 21 of the active-mirror element 2. The active-mirror element 2 absorbs typically about 60% of the incident pumping power. The area of the laser mode 10 on the active-mirror element 2 can be about $10^4$ times larger than the mode area on the facet of an edge-emitting laser, offering scope for the generation of high average power and large pulse energy. At the same time the external cavity 1 enforces fundamental mode operation in a circular, near-diffraction-limited beam 10.

The laser resonator 1 is V-shaped, i.e., once folded by a spherical folding mirror 8. The folding mirror 8 simultaneously acts as an output-coupler mirror and has, e.g., a radius of 10 mm and a transmission of 0.4% at a laser wavelength of about 1030 nm.

The embodiment of a laser according to the invention shown in FIG. 1 is an optically pumped semiconductor vertical-external-cavity surface-emitting laser (OPS-VECSEL) passively mode locked by a SESAM 5. In preliminary experiments, the VECSEL of FIG. 1 emitted pulses of 26 ps FWHM duration at 1030 nm, with a repetition rate variable around 4.4 GHz.

Figure 2:
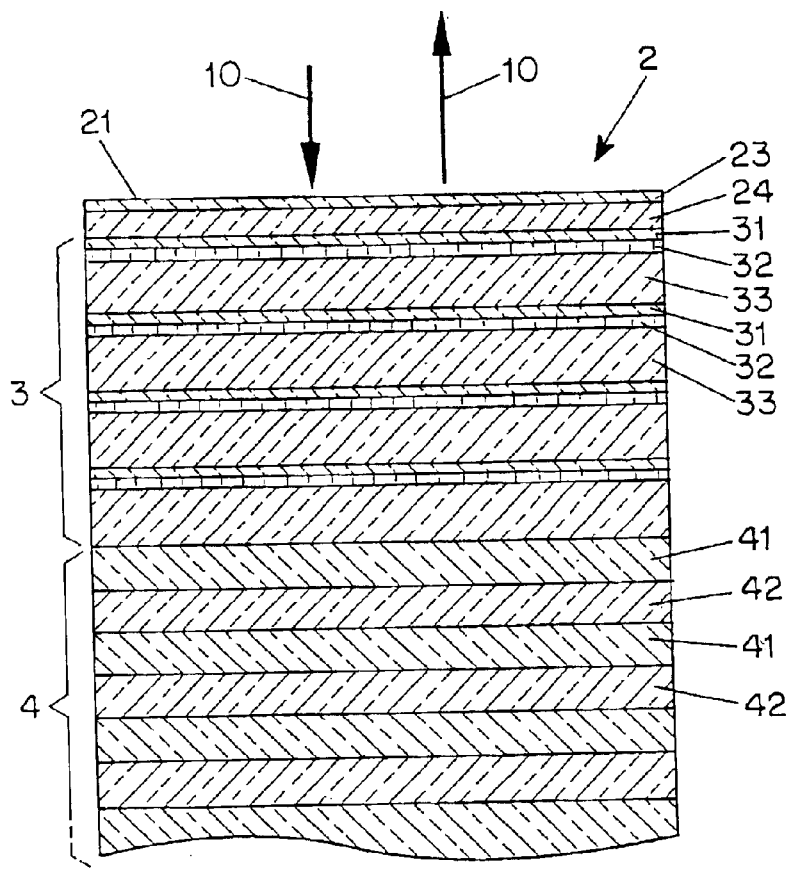
FIG. 2 is a schematic cross-section of a semiconductor active-mirror element used in a preferred embodiment of the EXSEL according to the invention.

FIG. 2 shows an example of a semiconductor active-mirror element 2 which can be used for the EXSEL according to the invention. The various layers can be grown, e.g., by the well-known metalorganic-chemical-vapor-deposition. (MOCVD) or molecular-beam-epitaxy (MBE) technique on a GaAs substrate 28 (not shown in FIG. 2). The Bragg mirror 4 comprises, e.g., a 27-repeat stack of pairs of AlAs layers 41 and $Al_{0.1}Ga_{0.9}As$ layers 42. The multiple-quantum-well gain structure 3 on top of the Bragg mirror 4 consists of a stack of 12 (only 4 are shown in FIG. 2) compressively strained $In_{0.2}Ga_{0.8}As$ quantum wells 31 together with $GaAs_{0.94}P_{0.06}$ strain-compensating layers 32, of thickness adjusted to balance the net strain in the structure to zero. The GaAsP layers 32 are separated from the InGaAs quantum wells 31 by GaAs layers 33 which space the wells at half-wave intervals. A window layer 24 of 450-nm-thick $Al_{0.43}Ga_{0.57}As$ is grown over the multiple-quantum-well gain structure 3 to keep carriers away from the front surface 21. The front surface 21 is finished with a 10-nm-thick capping layer 23 of GaAs.

After growing the layers described above on a wafer, platelets 2 with an area of approximately 5×5 mm are cleaved from the wafer, lapped and polished to reduce the GaAs substrate 28 to a thickness of about 200 $\mu$m, and attached to a copper heat sink 29 using indium metal (cf FIG. 1). The spectrum of photoluminescence emitted from such a cleaved platelet 2 edge shows a strong peak at about 980 nm. The platelets 2 exhibit lasing at wavelengths over the range 1000–1040 nm, governed by the temperature, and also by variation in layer thickness across the wafer.

Figure 3:
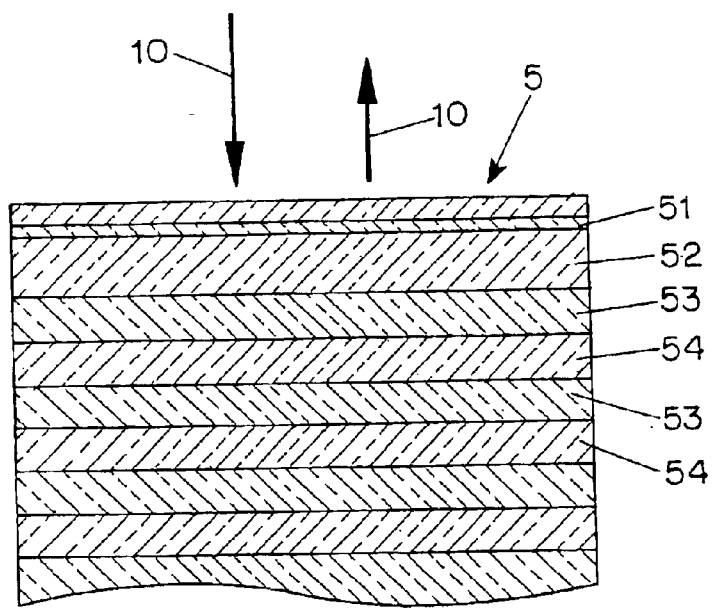
FIG. 3 is a schematic cross-section of a SESAM used in a preferred embodiment of the EXSEL according to the invention.

An exemplified embodiment of a SESAM 5 which can be used for the EXSEL according to the invention is shown in FIG. 3. This SESAM 5 consists of a Bragg mirror with a 25-repeat stack of pairs of AlAs layers 53 and GaAs layers 54, and a low-finesse anti-resonant $\lambda/2$ cavity 52 incorporating a single 20-nm-thick $In_{0.2}Ga_{0.8}As$ quantum well 51 grown by low-temperature (300° C.) molecular beam epitaxy (MBE). The low-intensity loss of such a SESAM 5 is about 1.3%, and the bleaching response is bi-temporal, with a 130-fs fast component and a 4-ps recovery time. Structures of this type are established as extremely versatile mode-locking devices for solid-state lasers (cf. U. Keller, K. J. Weingarten, F. X. Kärtner, D. Kopf, B. Braun, I. D. Jung, R. Fluck, C. Hönninger, N. Matuschek, and J. Aus der Au, IEEE J. Selected Topics in Quantum Electron. 2, 435, 1996).

Figure 4:
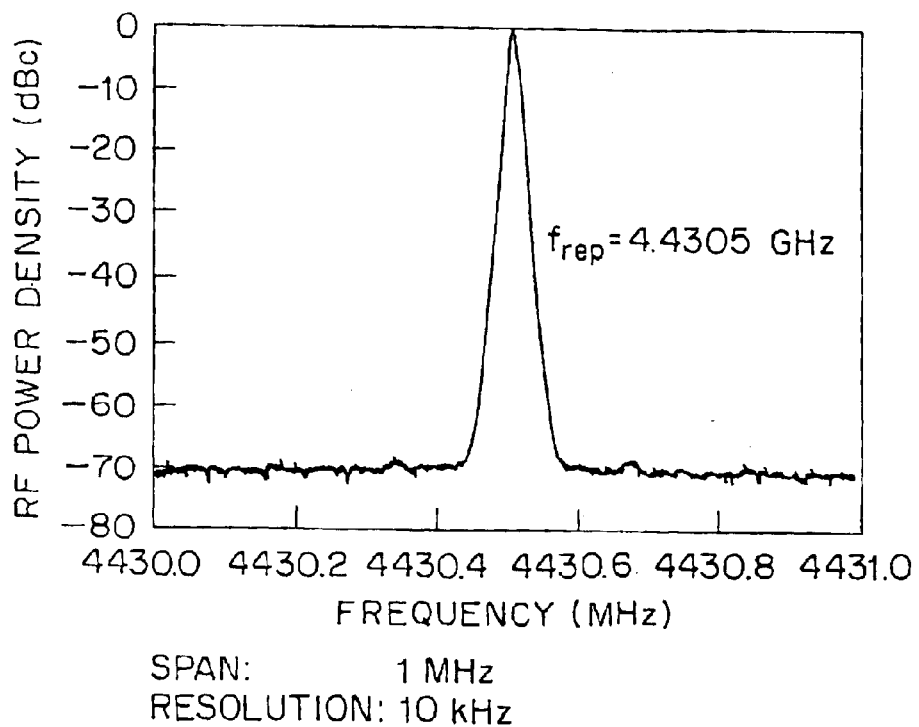
FIG. 4 is a graphical representation of the radio-frequency spectrum of the power output of the EXSEL of FIG. 1.

With 1.4 W of pumping power incident on the wafer the VECSEL illustrated by FIGS. 1–3 emits a total power of 21.6 mW divided equally between two output beams 10', 10". A further increase of the pumping power causes the output power to decrease due to thermal effects. The VECSEL exhibits stable, self-starting mode locking at the cavity round-trip repetition rate of 4.43 GHz. FIG. 4 shows the fundamental peak in the radio-frequency spectrum of the photocurrent from a fast diode monitoring the laser output. The signal was obtained with a 50-GHz photodiode and a 26-GHz amplifier and spectrum analyzer. Spectral measurements with smaller resolution bandwidth reveal a jitter of about 10 kHz, probably caused by weak fluctuations of the cavity length, on the order of 80 nm.

Figure 5:
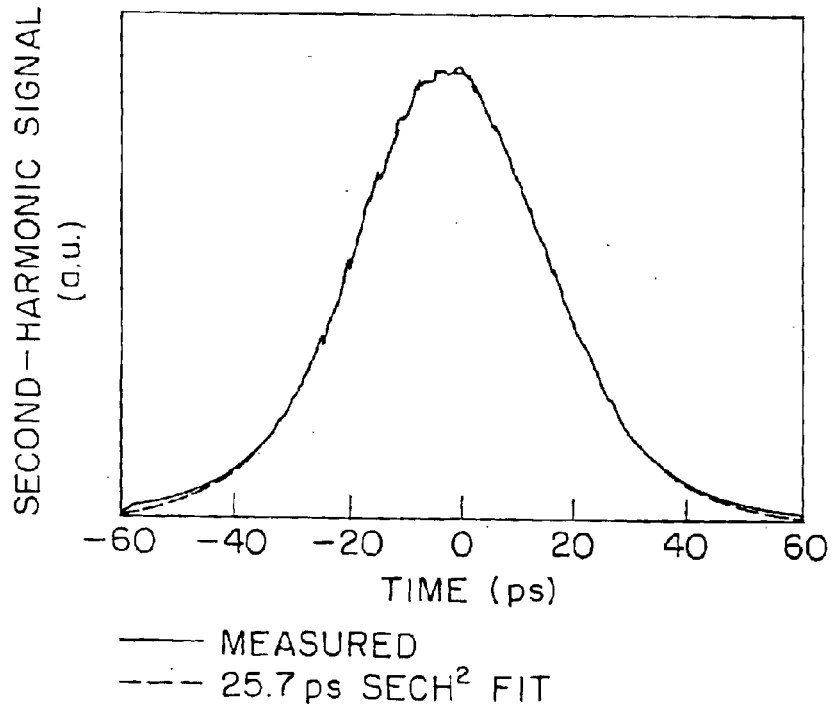
FIG. 5 is a graphical representation of the autocorrelation trace of mode-locked pulses (solid curve) emitted by the EXSEL of FIG. 1, and a fit to the data assuming a hyperbolic secant pulse profile with 25.7 ps FWHM.

A measured pulse autocorrelation trace is shown in FIG. 5 (solid curve), with a best fit to a hyperbolic secant profile (dashed curve) for which the FWHM pulse duration is assumed to be 25.7 ps.

Figure 6:
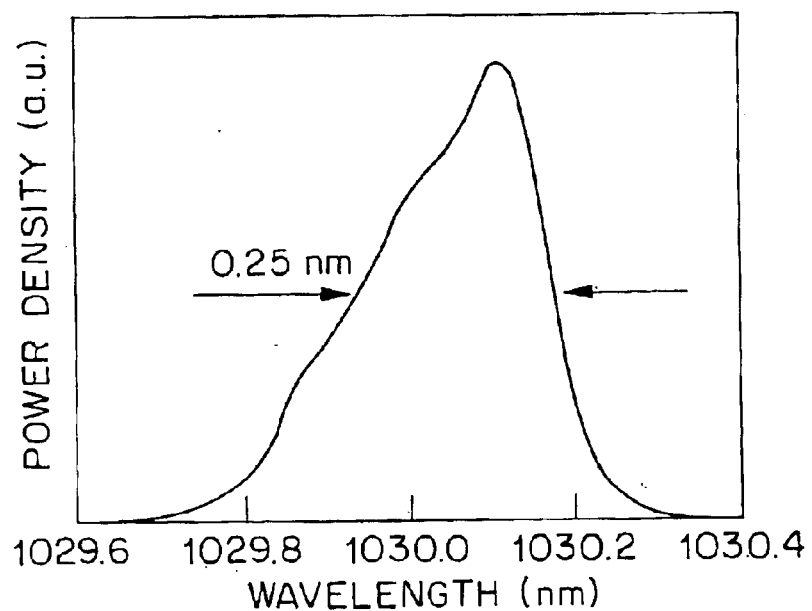
FIG. 6 is a graphical representation of the measured spectral profile of the mode-locked output of the EXSEL of FIG. 1.

FIG. 6 shows the optical spectrum of the VECSEL illustrated by FIGS. 1–3, with a bandwidth of 0.25 nm FWHM, corresponding to a time-bandwidth product for these pulses of about 1.8. Even within the restricted bandwidth the pulses are strongly chirped by gain saturation, which self-phase-modulates the pulses. In a synchronously pumped VECSEL this effect may partially be offset by the external phase modulation induced by pulsed pumping, which is of opposite sign (cf. W. Jiang and J. E. Bowers, in "Compact Sources of Ultrashort Pulses", edited by Irl N. Duling III, C. U. P., 1995) Nevertheless, external compression of pulses from synchronously pumped VECSELs by three orders of magnitude, to 21 fs duration has been reported (W. H. Xiang, S. R. Friberg, K. Watanabe, S. Machida, Y. Sakai, H. Iwamura and Y. Yamamoto, Appi. Phys. Lett. 59, 2076, 1991).

Whereas the intrinsic quantum-well gain extends over tens of nanometers, the bandwidth of the VECSEL may be restricted by a coupled cavity effect arising from residual transmission through the Bragg mirror 4 and reflection from the In-coated back surface 22 of the substrate 28. Roughening or angle-polishing of the back surface 22 eliminates this effect. A further sub-cavity can be formed by the Bragg mirror 4 and Fresnel reflection from the front surface 21 of the active-mirror element 2, with a free spectral range of about 40 nm. This sub-cavity is operating near, resonance at the laser wavelength and thus may somewhat decrease the laser threshold and also lower the effective gain saturation fluence to a value well below the absorption saturation fluence of the anti-resonant SESAM. The V-cavity 1 is therefore preferably made asymmetric so as to focus the cavity mode more tightly on the SESAM 5 than on the active-mirror element 2. The lengths of the cavity legs containing the SESAM 5 and the active-mirror element 2 are, e.g., 6 mm and 28 mm. respectively, giving a ratio of the mode area on the gain structure 3 to that on the SESAM 5 of about 40. A further reduction of the mode-area ratio produces progressive lengthening of the pulses up to about 80 ps and finally a regime with noisy pulsing. Substantial increases of output power can be achieved by diode-bar-pumped devices with improved thermal management and wafer design.

Figure 7:
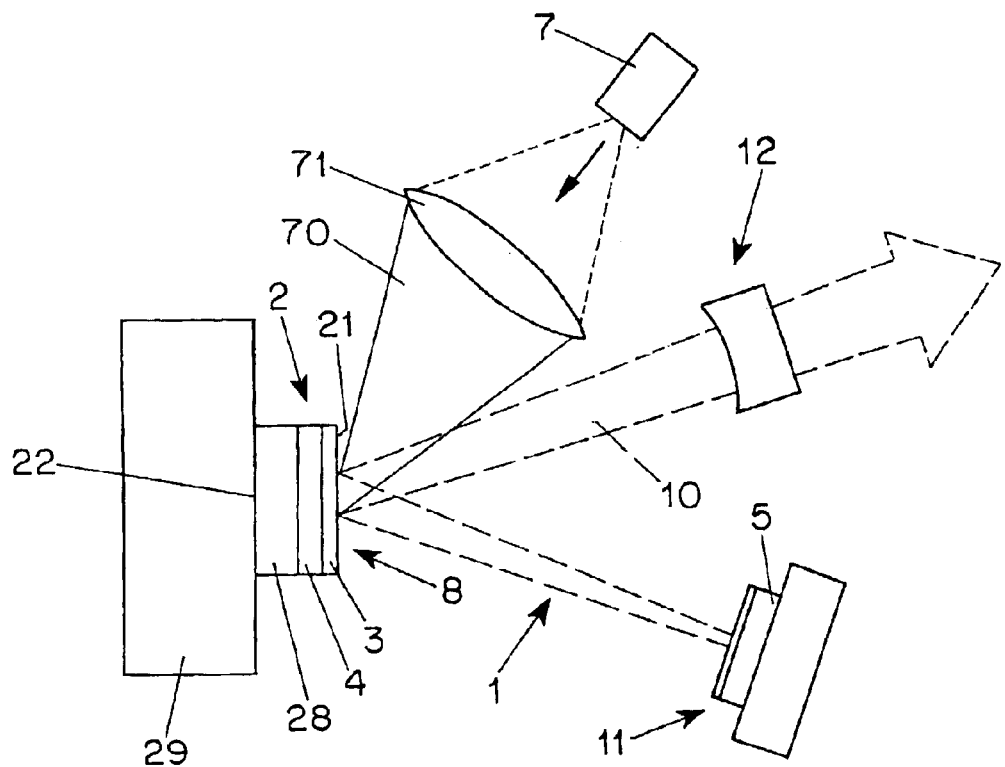
FIGS. 7–9 are schematic illustrations of further embodiments of EXSELs according to the invention.
Figure 8:
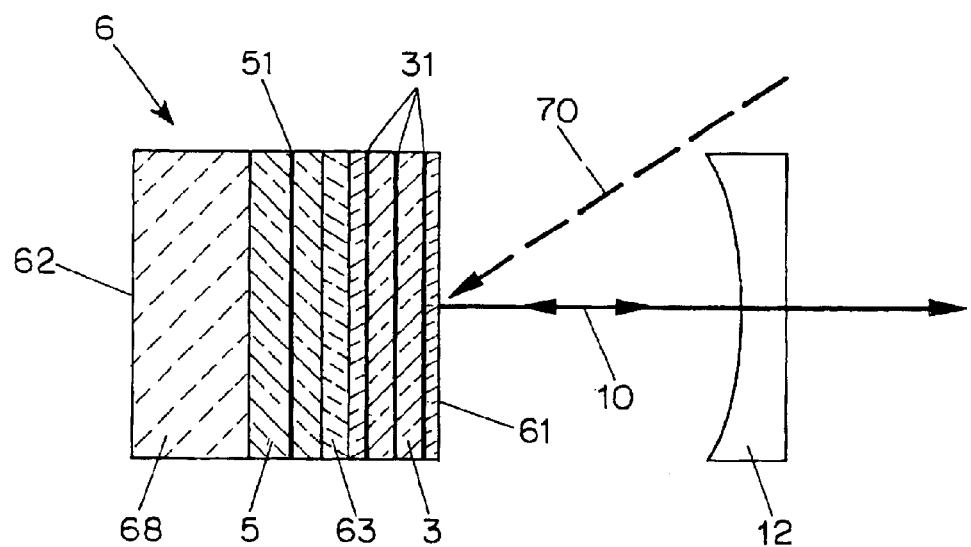
Figure 9:
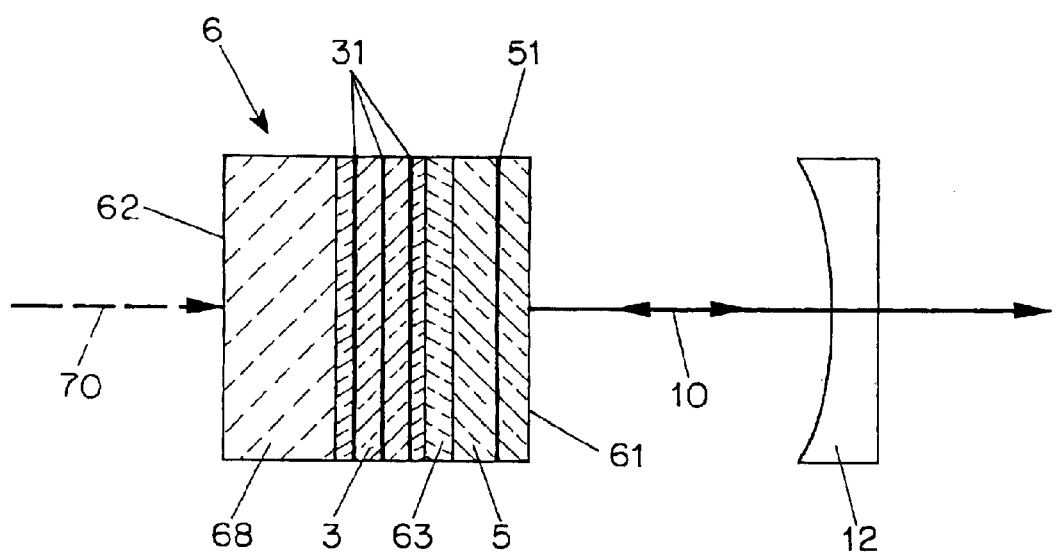

Further embodiments of lasers according to the invention are shown in FIGS. 7–9.

The laser of FIG. 7 has also a V-shaped laser resonator 1, but unlike the embodiment of FIG. 1, the active-mirror element 2 is used as the folding mirror 8. The resonator 1 is delimited by the SESAM 5 and the output-coupler mirror 12.

FIGS. 8 and 9 show .embodiments in which the gain structure 3 and the absorber structure 5 are integrated within the same element 6, referred to as the "active-absorber-mirror element". The various layers are not shown in detail. In FIG. 8, the gain structure 3, with one quantum well 31 or with a plurality of quantum wells, is placed on top of the active-absorber-mirror element 6. The gain structure 3 is followed by an intermediate element 63 which essentially reflects pumping light 70 but essentially transmits laser radiation 10. The pumping light 70 in this embodiment impinges on the gain structure 3 from a front surface 61 of the active-absorber-mirror element 6. The intermediate element 63 is followed by an absorber structure 5 with one quantum well 51 or with a plurality of quantum wells. All these elements are grown on a substrate 68. The active-absorber-mirror element 6 and an external mirror 12 form a laser cavity 1. In the embodiment of FIG. 9, the gain structure 3 is adjacent to the substrate 68. The pumping light 70 passes through the substrate 68 and impinges on the gain structure 3 from the back surface 62 of the active-absorber-mirror element 6. The absorber structure 5 and the gain structure 3 are again separated by an intermediate element 63 which essentially reflects pumping light 70 but essentially transmits laser radiation 10.

Figure 10:
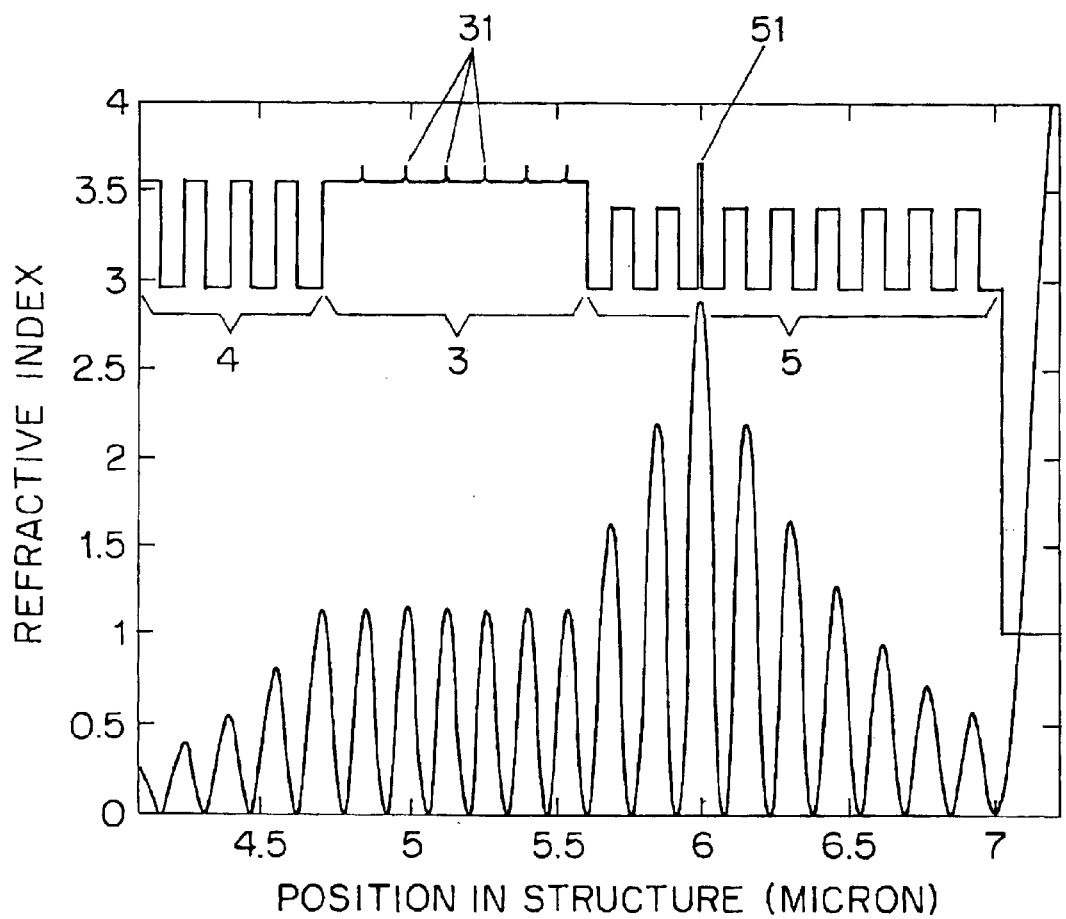
FIG. 10 is a graphical representation of the refractive-index profile and the field pattern of an EXSEL according to the invention.

FIG. 10 shows a refractive-index profile (top) and a calculation of the field pattern (bottom) of an active-absorber-mirror element 6 used, e.g., in the embodiment of FIG. 9. On top of the active-absorber-mirror element 6 an absorber structure 5 is grown. With discrete elements the saturation energy of the absorber structure 5 and of the gain structure 3 is adjusted by more or less tight focusing of the laser mode. In an active-absorber-mirror element 6 the intensity and thereby the saturation energy can be varied by utilizing the standing-wave pattern. In the absorber structure 5 of FIG. 10 a resonant Fabry-Perot cavity is used for the absorber 5 to increase the intensity and thereby decrease the effective absorber saturation energy. The pumping light 70 is mostly transmitted through the absorber structure 5, mainly because the absorber quantum well 51, in contrast to the amplifying quantum wells 31, is not surrounded by pump-absorbing material. The amplifying quantum wells 31 are excited mainly by carriers which are created in the surrounding medium 33 and transferred from there to the quantum wells 31. Hence the pumping light 70 can be transferred through the saturable absorber 5 without significantly exciting the latter, while the higher peak intensity of the circulating laser pulse 10 can still saturate the absorber 5.

An example of the design of an active-absorber-mirror element 6 as shown in FIG. 10 is given in Table I.

TABLE I

| Element | Layer | Material | Refractive index @ 1030 mn | Thickness (nm) | Number of layers |
|---|---|---|---|---|---|
| Air | — | Air | 1 | — | — |
| Resonant structure 5 | Low-index | AlAs | 2.95 | 83 | 10 |
|  | High-index | $Al_{0.2}Ga_{0.8}As$ | 3.40 | 73 | 8 |
| Saturable absorber 51 | Quantum-well | $In_{0.17}Ga_{0.83}As$ | 3.62 | 8 | 1 |
| Gain structure 3 | Base | GaAs | 3.54 | 61 | 7 |
|  | Quantum-well | $In_{0.17}Ga_{0.83}As$ | 3.62 | 8 | 6 |
| Bragg reflector 4 | Low-index | AlAs | 2.95 | 83 | 25 |
|  | High-index | GaAs | 3.54 | 69 | 25 |
| Substrate 28 | — | GaAs | 3.54 | — | — |

Numerous other embodiments may be envisaged, without departing from the spirit and scope of the invention.

What is claimed is:

1. A laser for emitting pulsed electromagnetic laser radiation, said laser comprising a first reflective element and a second reflective element being separated therefrom, said first and second reflective elements defining an optical resonator-for laser radiation;

an essentially plane semiconductor gain structure having a surface extending essentially in a surface plane, for emitting said laser radiation non-edge-wise;

means for exciting said semiconductor gain structure to emit said laser radiation from said surface plane, said exciting means comprising a pumping source for emitting pumping radiation which impinges on said semiconductor gain structure; and a semiconductor saturable absorber structure within the optical resonator for mode-locking said laser radiation.

2. The laser according to claim 1 wherein said semiconductor gain structure is a quantum-well structure.

3. The laser according to claim 1 wherein said laser radiation is in the form of a laser beam, said laser beam having defined areas of cross section on said semiconductor gain structure and on said semiconductor saturable absorber, and wherein said optical resonator is designed in such a way that the area of cross section on said semiconductor gain structure is larger than the area of cross section on said semiconductor saturable absorber.

4. The laser according to claim 1 wherein said semiconductor absorber structure is a quantum-well structure.

5. The laser according to claim 1 wherein said semiconductor saturable absorber is a semiconductor saturable absorber mirror acting as a third reflective element placed inside said optical resonator.

6. The laser according to claim 1, comprising a Bragg reflector, said Bragg reflector acting as one of said two reflective elements defining said optical resonator.

7. The laser according to claim 6 wherein said Bragg reflector and said semiconductor gain structure are realized as stacks of semiconductor layers on a common substrate.

8. The laser according to claim 1 wherein said optical resonator is V-shaped.

9. The laser according to claim 1 wherein said optical resonator comprises a spectral filter for harmonic mode locking.

10. The laser according to claim 1 wherein, for harmonic mode locking, said saturable absorber is placed at a location within said optical resonator where counterpropagating pulses meet.

11. The laser according to claim 1 wherein said pumping source comprises a diode laser.

12. The laser according to claim 1 wherein said semiconductor gain structure is mounted on a heat sink.

13. The laser according to claim 1 wherein said semiconductor gain structure and said semiconductor saturable absorber are realized as stacks of semiconductor layers on a common substrate.

14. A method for generating pulsed electromagnetic laser radiation, comprising the steps of generating pumping radiation with a photon source;

exciting an essentially plane semiconductor gain structure, which has a surface extending essentially in a surface plane, to emit laser radiation from said surface non-edge-wise, by impinging said pumping radiation on said semiconductor gain structure;

recirculating said laser radiation by means of first and second reflective elements defining an optical resonator; and mode-locking said laser radiation by means of a semiconductor saturable absorber structure within the optical resonator.

15. The method according to claim 14 wherein said semiconductor gain structure is a quantum-well structure.

16. The method according to claim 14 wherein said semiconductor absorber structure is a quantum-well structure.

17. The method according to claim 14 wherein said laser radiation is generated in the form of a laser beam, said laser beam having defined areas of cross section on said semiconductor gain structure and on said semiconductor saturable absorber structure, and wherein said optical resonator is designed in such a way that the area of cross section on said semiconductor gain structure is larger than the area of cross section on said semiconductor saturable absorber structure.

18. The method according to claim 14 wherein said laser radiation is reflected from said semiconductor absorber structure.

19. The method according to claim 14 wherein harmonic mode locking is performed.

20. A laser for emitting pulsed electromagnetic laser radiation, said laser comprising a first reflective element and a second reflective element being separated therefrom, said first and second reflective elements defining an optical resonator for laser radiation;

an essentially plane semiconductor gain structure having a surface extending essentially in a surface plane, for emitting said laser radiation non-edge-wise;

means for exciting said semiconductor gain structure to emit said laser radiation from said surface plane, said exciting means comprising a pumping source for emitting pumping radiation which impinges on said semiconductor gain structure; and a reflective semiconductor saturable absorber structure comprising one of said first and second reflective elements for mode-locking said laser radiation.

21. The laser according to claim 20 wherein said semiconductor gain structure is a quantum-well structure.

22. The laser according to claim 20 wherein laser radiation is in the form of a laser beam, said laser beam having defined areas of cross section on said semiconductor gain structure and on said semiconductor saturable absorber, and wherein said optical resonator is designed in such a way that the area of cross section on said semiconductor gain structure is larger than the area of cross section on said semiconductor saturable reactor.

23. The laser according to claim 20 wherein said semiconductor absorber structure is a quantum-well structure.

24. The laser according to claim 20 comprising a Bragg reflector, said Bragg reflector acting as one of the first and second reflective elements defining said optical resonator.

25. The laser according to claim 24 wherein said Bragg reflector and said semiconductor gain structure are realized as stacks of semiconductor layers on a common substrate.

26. The laser according to claim 20 wherein said optical resonator is V-shaped.

27. The laser according to claim 20 wherein said optical resonator comprises a spectral filter for harmonic mode locking.

28. The laser according to claim 20 wherein, for harmonic mode locking, said saturable absorber is placed at a location in said optical resonator where counterpropagating pulses meet.

29. The laser according to claim 20 wherein said pumping source comprises a diode laser.

30. The laser according to claim 20 wherein said semiconductor gain structure is mounted on a heat sink.

31. The laser according to claim 20 wherein said semiconductor gain structure and said semiconductor saturable absorber are realized as stacks of semiconductor layers on a common substrate.

32. A method for generating pulsed electromagnetic laser radiation, comprising the steps of generating pumping radiation with a photon source;

exciting an essentially plane semiconductor gain structure, which has a surface extending essentially in a surface plane, to emit laser radiation from said surface non-edge-wise, by impinging said pumping radiation on said semiconductor gain structure;

recirculating said laser radiation by means of first and second reflective elements defining an optical resonator; and mode-locking said laser radiation by means of a reflective semiconductor saturable absorber structure comprising one of said first and second reflective elements.

33. The method according to claim 32 wherein said semiconductor gain structure is a quantum-well structure.

34. The method according to claim 32 wherein said semiconductor absorber structure is a quantum-well structure.

35. The method according to claim 32 wherein said laser radiation is generated in the form of a laser beam, said laser beam having defined areas of cross section on said semiconductor gain structure and on said semiconductor saturable absorber, and wherein said optical resonator is designed in such a way that the area of cross section on said semiconductor gain structure is larger than the area of cross section on said semiconductor saturable reactor.

36. The method according to claim 14 wherein harmonic mode locking is performed.

* * * * *